(12) United States Patent
Uchiyama

(10) Patent No.: US 6,630,708 B1
(45) Date of Patent: Oct. 7, 2003

(54) NON-VOLATILE MEMORY AND METHOD FOR FABRICATING THE SAME

(75) Inventor: Akira Uchiyama, Tokyo (JP)

(73) Assignee: Oki Electric Industry Co., Ltd., Tokyo (JP)

(*) Notice: Subject to any disclaimer, the term of this patent is extended or adjusted under 35 U.S.C. 154(b) by 88 days.

(21) Appl. No.: 09/703,609

(22) Filed: Nov. 2, 2000

(30) Foreign Application Priority Data

Mar. 10, 2000 (JP) ........................................ 2000-066703

(51) Int. Cl.⁷ .............................................. H01L 29/788
(52) U.S. Cl. ........................ 257/316; 257/320; 257/330
(58) Field of Search ................................. 257/315, 316, 257/330, 329, 320, 317, 306, 322, 318–319, 314, 549, 506, 524; 438/201, 211, 257, 259

(56) References Cited

U.S. PATENT DOCUMENTS 5,721,442 A * 2/1998 Hong .......................... 257/316
6,190,968 B1 * 2/2001 Kalnitsky et al. ........... 438/529

OTHER PUBLICATIONS

Mori et al., Reliability Physics Symposium, 1990. 28th Annual Proceedings., International, pp. 132–144.*

* cited by examiner

Primary Examiner—Wael Fahmy
Assistant Examiner—(Vikki) Hoa B. Trinh
(74) Attorney, Agent, or Firm—Volentine Francos, PLLC

(57) ABSTRACT

A non-volatile memory includes a substrate: a floating gate electrode and a control gate electrode formed on the substrate; and an active layer formed around the control gate and the floating gate. The active layer has source and drain and a channel layer between the source and drain.

20 Claims, 10 Drawing Sheets

NON-VOLATILE MEMORY AND METHOD FOR FABRICATING THE SAME

CROSS REFERENCE TO RELATED APPLICATION

This application claims the priority of Application No. 2000-066703, filed Mar. 10, 2000 in Japan, the subject matter of which is incorporated herein by reference.

TECHNICAL FIELD OF THE INVENTION

The present invention relates to a non-volatile memory such as an EEPROM (Electrically Erasable and Programmable Read Only Memory) and a flash memory. The present invention also relates to a method for fabricating a non-volatile memory.

BACKGROUND OF THE INVENTION

A conventional non-volatile memory is described, for example, in a Japanese Laying Open Publication H05-315622.

FIG. 1 shows a conventional non-volatile memory shown in the above-described Japanese publication. The non-volatile memory includes a p-type silicon substrate 1 having a square shape of cavity (groove) therein. The cavity is provided at a side wall and a bottom surface with an insulating layer 2 having a pass-through hole 2a at the center. On the inside wall of the insulating layer 2, a control gate electrode 3, an inter-gate insulating layer 4, a floating gate electrode 5 and an insulating layer 6 are formed in order toward the center of the cavity. A drain drawing electrode 7 is buried in the insulating layer 6.

A drain region 8 is formed under the pass-through hole 2a on the silicon substrate 1 so as to reach a region under the floating gate electrode 5. A source region 9 is formed around the cavity on the upper surface of the silicon substrate 1. In such a non-volatile memory, the insulating layer 2 is used as a tunnel oxide layer 2x at a region between the floating gate electrode 5 and the silicon substrate 1. Further, the insulating layer 2 is used as a gate insulating layer 2y at a region being in contact with the control gate electrode 3. A channel C is formed at a region radially extending from the bottom center of the cavity toward the upper surface of the silicon substrate 1.

In operation, in order to write data in the memory, the source region 9 is kept at 0V, and the drain region 8 and control gate electrode 3 are applied with a positive voltage to allow electric current flow through them. Thermoelectrons are generated around the drain region 8 and are implanted in the floating gate electrode 5 through the tunnel oxide layer 2x. In order to delete data stored in the memory, the control gate electrode 3 is kept at 0V, and the drain region 8 is applied with a positive voltage so that electrons are taken out of the floating gate electrode 5.

In order to read data out of the memory, a voltage (potential) is applied between the drain region 8 and source region 9, and the amount of electric current flowing through them is detected. If some electrons are implanted in the floating gate electrode 5, positive electric field of the control gate electrode 3 is reduced. As a result, no channel is made at the bottom surface of the cavity under the floating gate electrode 5 and only a small amount of electric current flows there. On the other hand, if no electron is implanted in the floating gate electrode 5, positive electric field of the control gate electrode 3 is applied to the silicon substrate 1 under the control gate electrode 3. As a result, a channel is made and a large amount of electric current flows there.

According to the above described Japanese publication, the conventional non-volatile memory uses a part of the insulating layer 2 as the tunnel oxide layer 2x. The insulating layer formed between the floating gate electrode 5 and control gate electrode 3 is used as an inter-gate insulating layer between floating gate and control gate. As a result, the memory provides a larger coupling ratio and higher efficient of writing and deleting characteristics. At the same time, the supply voltage may be reduced.

However, according to the conventional non-volatile memory, the tunnel oxide layer 2x formed between the drain region 8 and floating gate electrode 5 is arranged at the center of the cavity for a memory cell. It is required to align an end of the floating gate and the drain region with a high accuracy. In order to realize such a high accuracy of alignment, the floating gate 5 must be formed to have a larger thickness. The tunnel oxide layer 2x is formed in plane parallel to the silicon substrate. Therefore, it is difficult to improve integration of the memory.

OBJECTS OF THE INVENTION

Accordingly, an object of the present invention is to provide a non-volatile memory of which the integration can be improved easily without lowering the characteristics and reliability thereof.

Another object of the present invention is to provide a method for fabricating a non-volatile memory in which the integration of the memory can be improved easily without lowering the characteristics and reliability thereof.

Additional objects, advantages and novel features of the present invention will be set forth in part in the description that follows, and in part will become apparent to those skilled in the art upon examination of the following or may be learned by practice of the invention. The objects and advantages of the invention may be realized and attained by means of the instrumentalities and combinations particularly pointed out in the appended claims.

SUMMARY OF THE INVENTION

According to a first aspect of the present invention, a non-volatile memory includes a substrate: a floating gate electrode and a control gate electrode formed on the substrate; and an active layer formed around the control gate and the floating gate. The active layer has source and drain and a channel layer between the source and drain.

The active layer may be formed to be overlapped with the floating gate electrode in a first direction, which is parallel to the silicon substrate. Other wise, the active layer is formed not to be overlapped completely with the floating gate electrode in the first direction.

According to a second aspect of the present invention, a method for fabricating a non-volatile memory includes the steps of providing a first conductive type of silicon substrate; etching the silicon substrate to form a groove extending two orthogonal directions in matrix; forming a cell isolating insulation layer in the groove; etching the silicon substrate to form a cavity for each memory cell and a first conductive type of active region on an inner surface of the cavity; forming a common source region on the silicon substrate entirely; forming a drain region on the active region; forming a first insulating layer on the common source region at the bottom of the cavity; forming a second insulating layer on an inner side surface of the cavity surrounded by the active region; forming a second conductive type of floating gate electrode on an inner side surface of the second insulating layer; forming a third insulating layer on an inner side surface of the floating gate electrode; and forming a second conductive type of control gate electrode in the cavity surrounded by the third insulating layer.

Another method includes the steps of: providing a first conductive type of silicon substrate; etching the silicon substrate to form a cavity for each memory cell and a first conductive type of active region left in the cavity; forming a common source region on the silicon substrate entirely and a drain region on the active region by a self alignment process; forming a gate insulating layer, a floating gate electrode, an inter-gate insulating layer and a control gate electrode are formed around the active region in order by a self alignment process; and forming a cell isolating insulation layer between two of the adjacent cavities.

DETAILED DISCLOSURE OF THE INVENTION

In the following detailed description of the preferred embodiments, reference is made to the accompanying drawings which form a part hereof, and in which is shown by way of illustration specific preferred embodiments in which the inventions may be practiced. These embodiments are described in sufficient detail to enable those skilled in the art to practice the invention, and it is to be understood that other embodiments may be utilized and that logical, mechanical and electrical changes may be made without departing from the spirit and scope of the present inventions. The following detailed description is, therefore, not to be taken in a limiting sense, and scope of the present inventions is defined only by the appended claims.

First Preferred Embodiment

Figure 1:
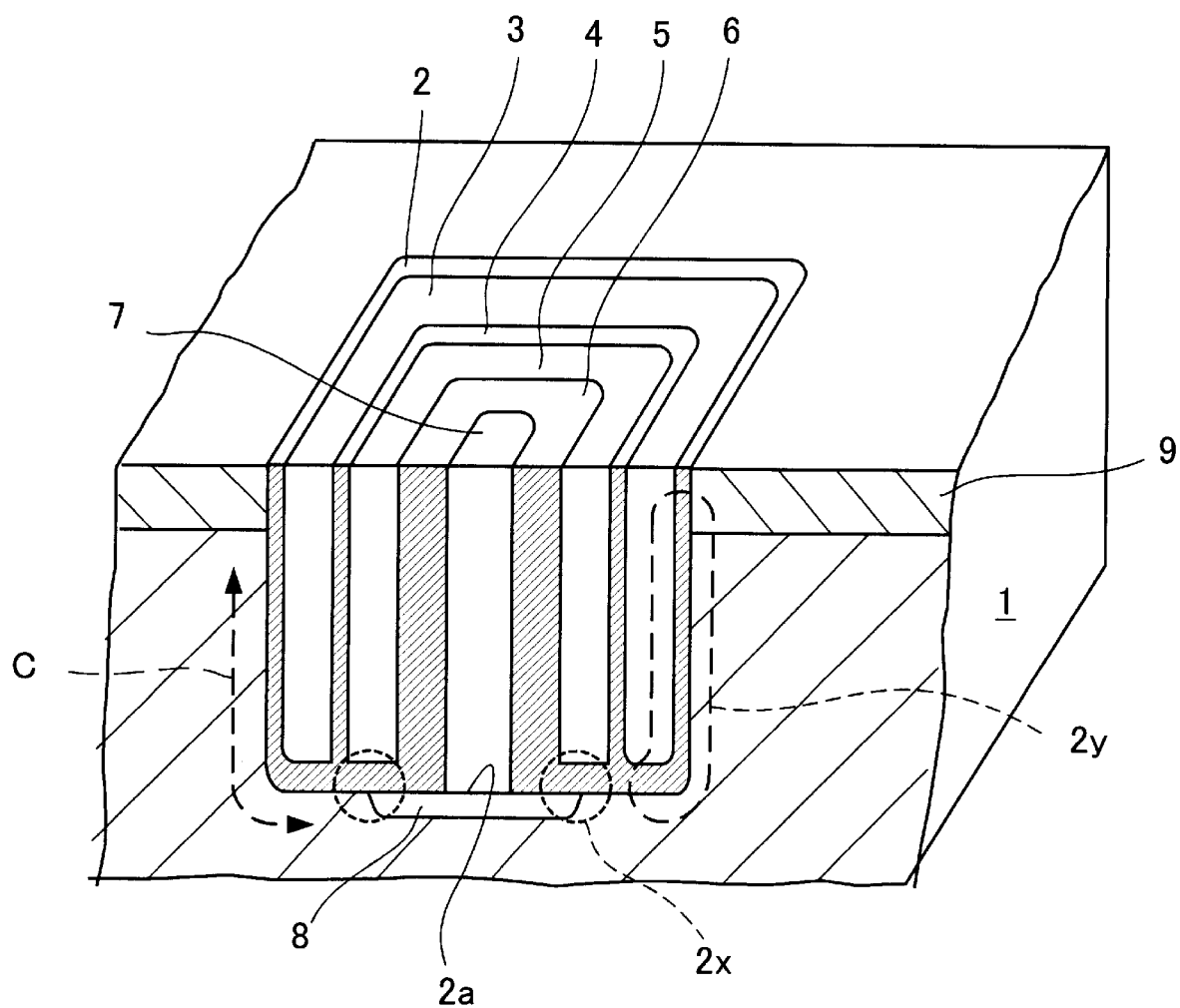
FIG. 1 is a cross-sectional view showing a part of a conventional non-volatile memory.
Figure 2:
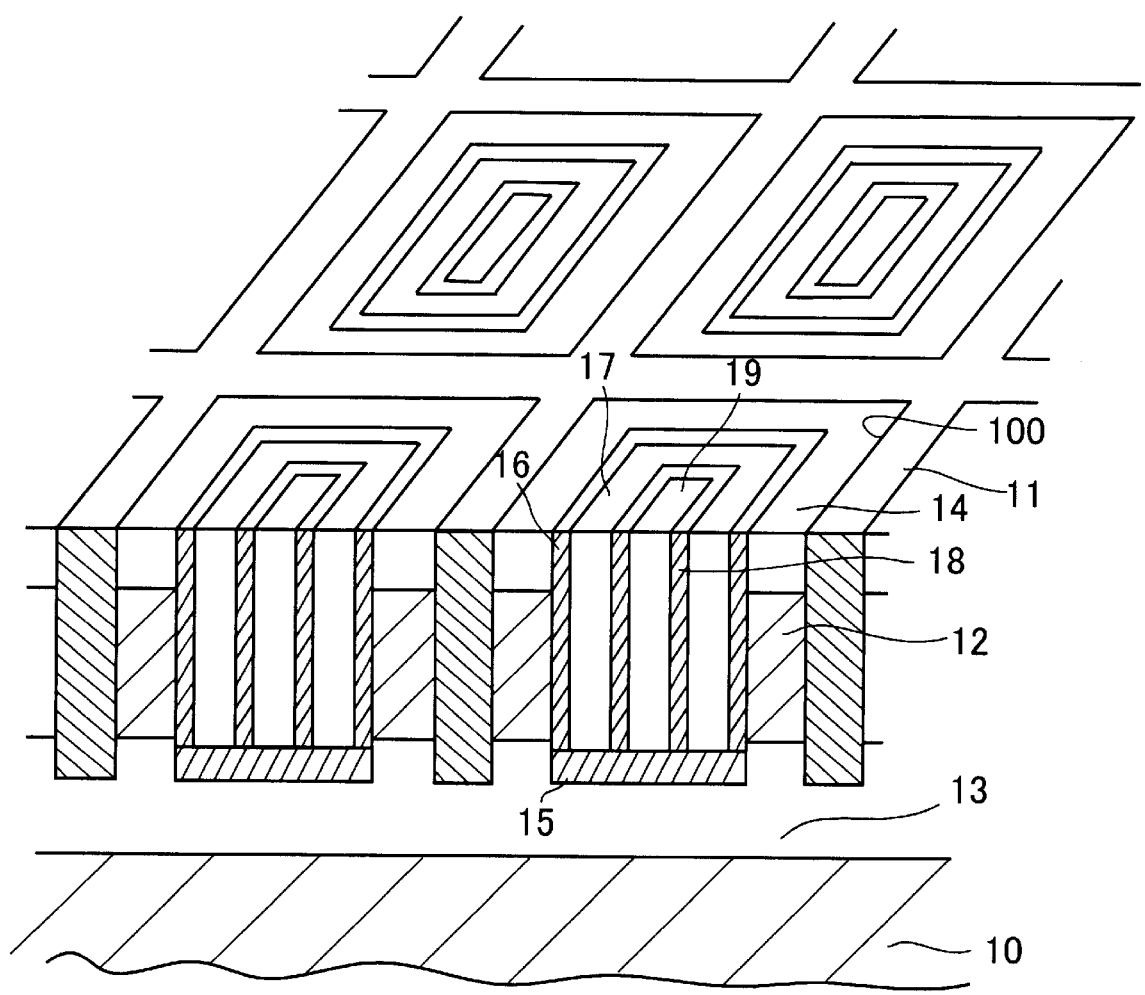
FIG. 2 is a cross-sectional view showing a part of a non-volatile memory according to a first preferred embodiment of the present invention.

FIG. 2 shows a part of a non-volatile memory according to a first preferred embodiment of the present invention. The non-volatile memory includes a p-type of silicon substrate 10, on which cell-isolating insulation layers 11 are formed in matrix to separate a plurality of memory cells. Each region or cavity 100 segmented by the cell-isolating insulation layers 11 is designed to have inside walls provided with active regions 12, which is a part of the p-type silicon substrate 10. The memory further includes a common source region 13 formed on the silicon substrate 10 under the active regions 12. In the common source region 13, high density n+ ions are implanted. A drain region 14 is formed on the active regions 12. In the drain region 14, n-ions are implanted. The common source region 13, active regions 12 and drain region 14 form a channel for a transistor, which is used for storing data.

A gate insulating layer 16 is formed on an inside surface of the active regions 12, which is shaped to be a square cylinder. The gate insulating layer 16 is also formed on an inside surface of the drain region 14. Another insulating layer 15 is formed on the common source region 13. The gate insulating layer 16, shaped to be a square cylinder, is provided at an inside wall with a floating gate electrode 17, made of conductive poly-silicon. An inter-gate insulating layer 18 is formed on an inside wall of the floating gate electrode 17. A control gate electrode 19 is formed inside the inter-gate insulating layer 18.

FIGS. 3A to 3I are cross-sectional views showing fabrication steps of the non-volatile memory, shown in FIG. 2. The non-volatile memory is fabricated in accordance with the following steps 1 to 9:

(1) Step 1

Figure 3A:
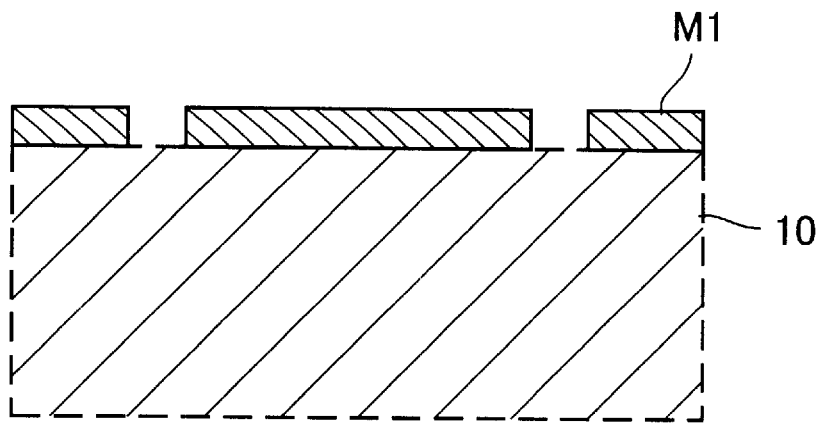
FIGS. 3A to 3I are cross-sectional views showing fabrication steps of the non-volatile memory, shown in FIG. 2.

First referring to FIG. 3A, a nitride layer is formed on a p-type silicon substrate 10, and the nitride layer is patterned to provide a mask pattern M1 including square islands arranged in matrix.

(2) Step 2

Figure 3B:
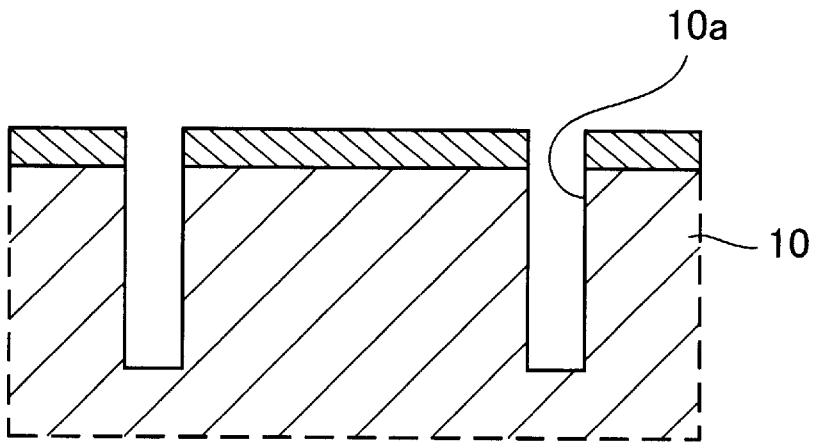

Referring to FIG. 3B, the silicon substrate 10 is dry-etched using the mask pattern M1 as an etching mask so that grooves 10a having, for example, width of about 0.1 to 0.2 $\mu$m and depth of about 0.3 to 1 $\mu$m are formed in matrix.

(3) Step 3

Figure 3C:
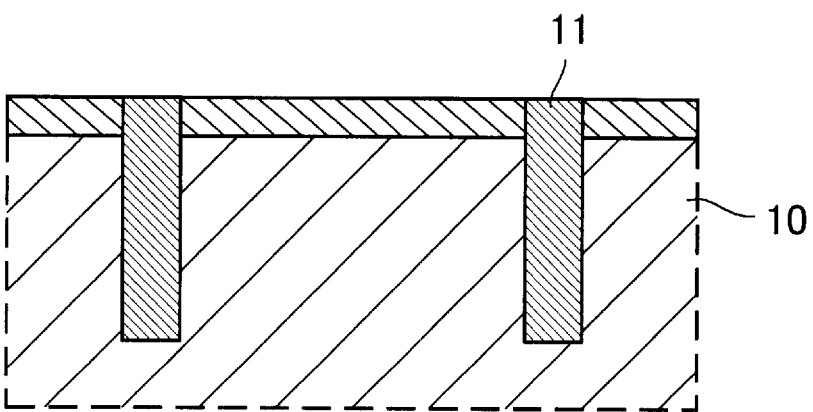

Referring to FIG. 3C, an oxide layer is formed on the structure, shown in FIG. 3B, by a process of CVD (Chemical Vapor Deposition). After that, the oxide layer is etched back to form a cell-isolating insulation layer 11 in each of the grooves 10a.

(4) Step 4

Figure 3D:
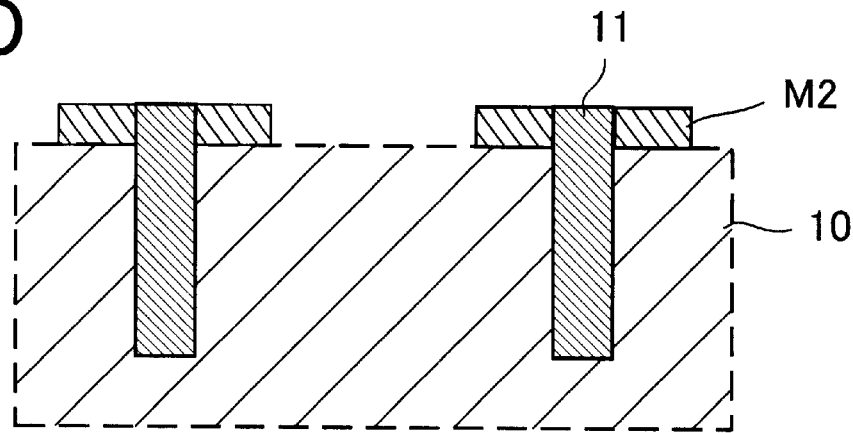

"Referring to FIG. 3D, the mask pattern M1 is removed and a nitride layer is formed thereon, so that the cell-isolating insulation layers 11 extend upwardly out of the silicon substrate 10. After that, the nitride layer is anisotropic-etched to form a mask pattern M2 around the cell-isolating insulation layers 11 on the silicon substrate 10 in a self-alignment manner."

(5) Step 5

Figure 3E:
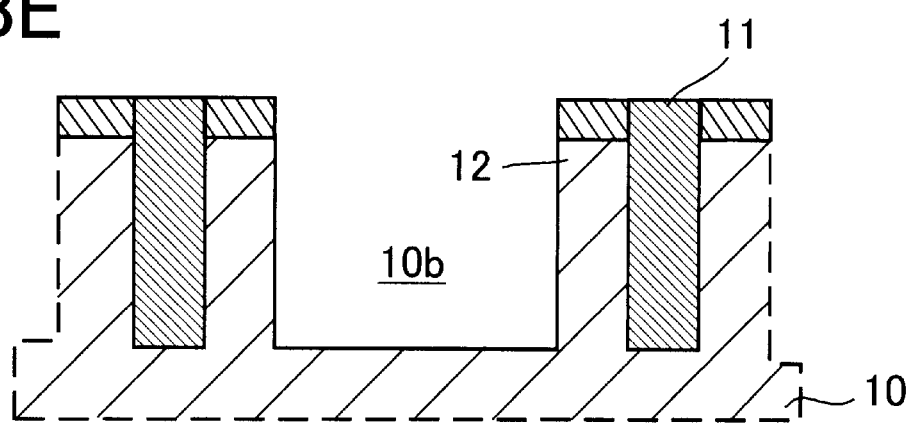

Referring to FIG. 3E, the silicon substrate 10 is dry-etched using the mask pattern M2 and cell-isolating insulation layers 11 as an etching mask so that active regions 12 of p-type silicon are formed on side surfaces of the cell-isolating insulation layers 11 and a cavity 10b is formed inside the active regions 12. The active regions 12 are formed under the mask pattern M2.

(6) Step 6

Figure 3F:
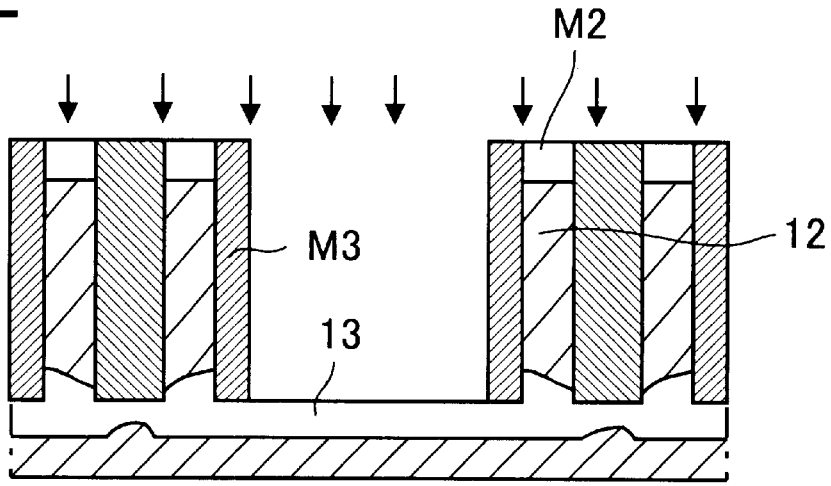
Figure 3G:
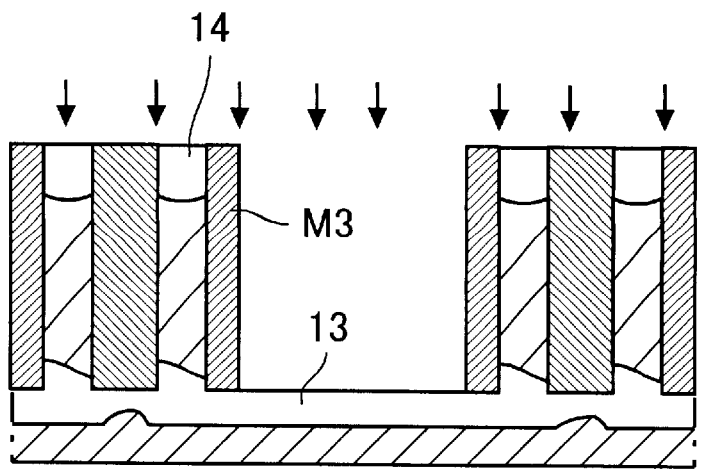

Referring to FIG. 3F, a nitride layer is formed on an inside wall of the cavity 10b to form a mask pattern M3, and then, high density n+ ions, such as arsenic and phosphorus, are implanted into the silicon substrate 10 using the mask pattern as a mask to form a common source region 13 on the silicon substrate 10. In the ion implanting process, conditions including dose amount and energy are controlled in accordance with size, temperature of thermal treatment, etc. so that adjacent two active regions 12, separated by the insulating layer 11, are connected to each other via the common source region 13. As a result, dopant impurities are diffused in two-dimensions and are introduced under the active regions 12 to form extended source region 13.

(7) Step 7

The entire of mask pattern M2 and upper portions of the cell-isolating insulation layers 11 are removed by etching, or using CMP. After that, n+ ions, such as arsenic and phosphorus, are implanted to form a drain region 14 on the active regions 12.

(8) Step 8

Figure 3H:
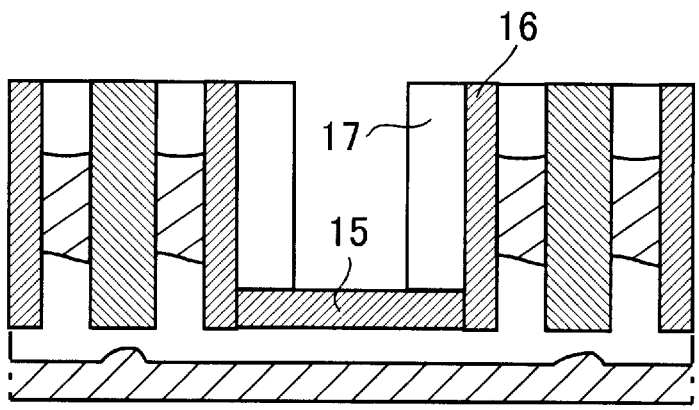

Next, referring to FIG. 3H, the mask pattern M3 is removed. After that, an insulating layer 15 is formed at the bottom of the cavity 10b on the source region 13 and a gate insulating layer 16 is formed on an inside wall of the cavity 10b to have a thickness of about 3 to 20 nm by processes such as thermal oxidation, CVD and etching-back. Subsequently, an n+ poly-silicon layer is formed and anisotropy etching is carried out to form a floating gate electrode 17 of n+ poly-silicon on the inside surface of the gate insulating layer 16. The floating gate electrode 17 is designed to have a thickness of about 0.05 to 0.2 μm.

(9) Step 9

Figure 3I:
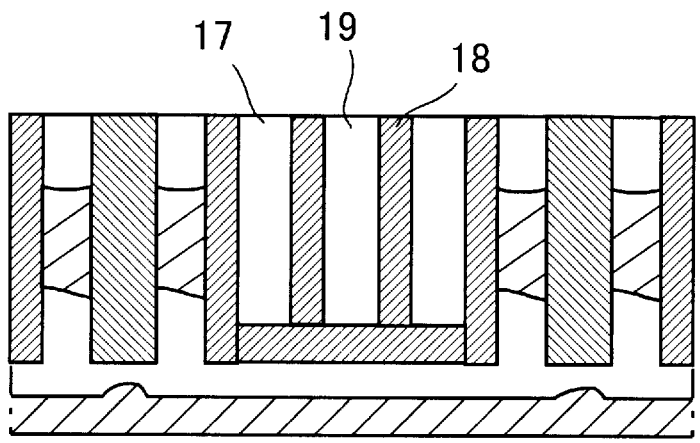

Now referring to FIG. 3I, an inter-gate insulating layer 18 is formed on the inside (inner side) surface of the floating gate electrode 17. The inter-gate insulating layer 18 is, for example, made of a layered structure of oxide layer and nitride layer. After that, n+ poly-silicon is filled in the center (inner) cavity surrounded by the inter-gate insulating layer 18 to form a control gate electrode 19.

(10) Step 10

Following the above-described steps, a wiring process is carried out for the drain regions 14 and control gate electrodes 19, so that the fabrication process of the non-volatile memory is completed. Such a non-volatile memory operates in the same manner as the conventional memory, as follows:

Writing operation of each memory cell is carried out by implanting and taking-out electrons to/from the floating gate electrode 17. For instance, in order to write data "1" into the memory cell, the drain region 14 and control gate electrode 19 are applied with a positive voltage to allow electric current flow between the drain region 14 and source region 13. Thermoelectrons are implanted in the floating gate electrode 17. In order to write data "0" into the memory cell, the common source region 13 is applied with a positive voltage so that the electrons are take out of the floating gate electrode 17.

In order to read data out of the memory cell, a source-drain threshold voltage is detected. Such a threshold voltage changes in accordance with electrons existing on the floating gate electrode 17.

As described above, according to the first preferred embodiment, the active region 12 and floating gate 17 for each memory cell are arranged to extend in the vertical direction relative to the silicon substrate 10 and to face each other. As a result, it is easy to fabricate the memory in which the active region 12 and floating gate 17 are facing each other at a larger area. And therefore, it is easy to align in position the active region 12 and floating gate 17 reliably and precisely, so that integration and performance of the non-volatile memory are improved.

In addition, according to the first preferred embodiment, a cross-sectional area of the channel region is larger as compared with the later-described third to sixth preferred embodiments, so that a large amount of electric current can be flowed therein; and therefore, the operating speed of the non-volatile memory becomes faster.

Second Preferred Embodiment

Figure 4:
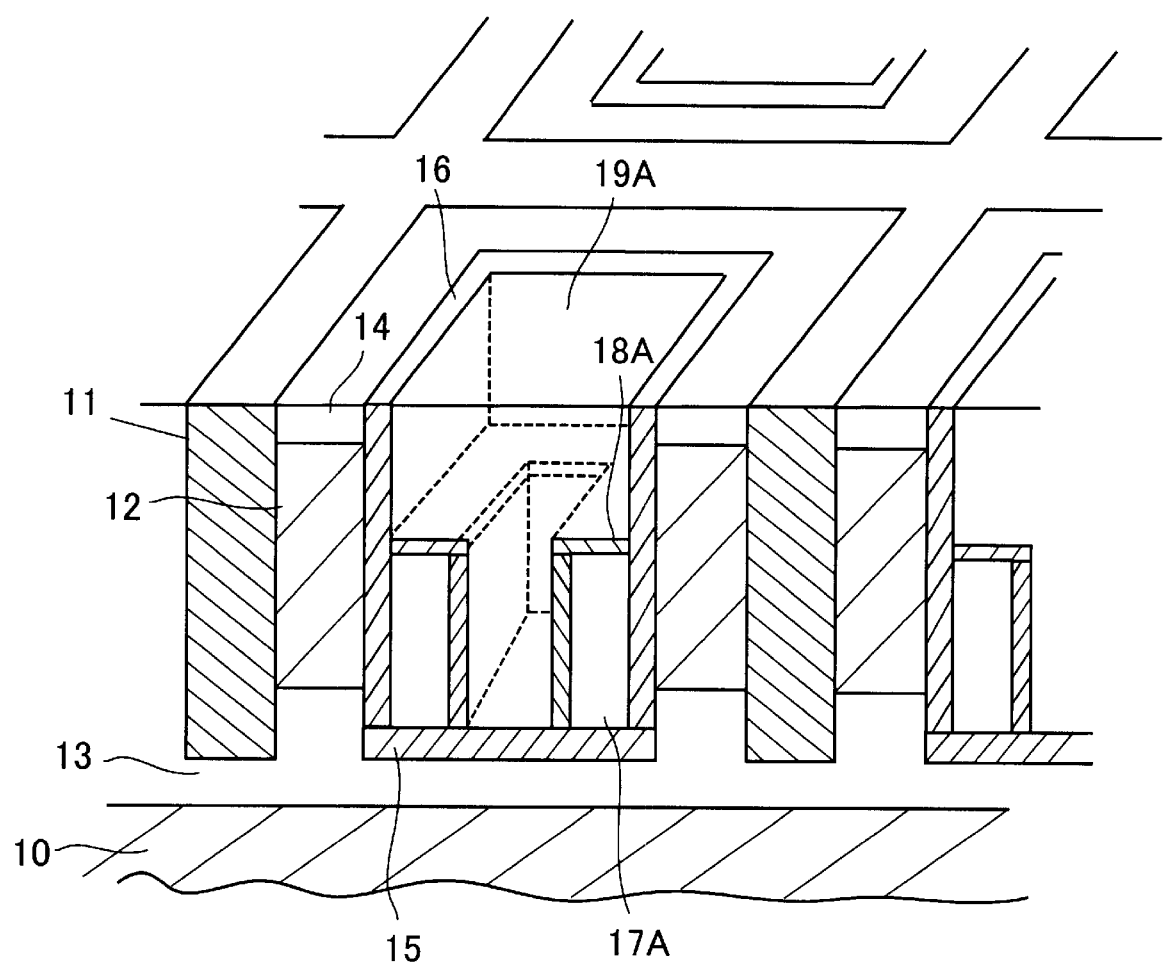
FIG. 4 is a cross-sectional view showing a part of a non-volatile memory according to a second preferred embodiment of the present invention.

FIG. 4 shows a non-volatile memory according to a second preferred embodiment of the present invention, in which the same or corresponding elements or components to those in the first preferred embodiment, shown in FIG. 2, are represented by the same reference symbols. The differences from the non-volatile memory according to the first preferred embodiment, shown in FIG. 2, is the structure of floating gate electrode and control gate electrode.

A non-volatile memory according to the second preferred embodiment includes a p-type of silicon substrate 10, on which cell-isolating insulation layers 11 are formed in matrix to separate a plurality of memory cells. Each region segmented by the cell-isolating insulation layers 11 is designed to have inside walls provided with active regions 12, which is a part of the p-type silicon substrate 10. The memory further includes a common source region 13 formed on the silicon substrate 10 under the active regions 12. In the common source region 13, high density n+ ions are implanted. A drain region 14 is formed on the active regions 12. In the drain region 14, n-ions are implanted. The common source region 13, active regions 12 and drain region 14 form a channel for a transistor, which is used for storing data.

A gate insulating layer 16 is formed on an inside surface of the active regions 12, which is shaped to be a square cylinder. The gate insulating layer 16 is also formed on an inside surface of the drain region 14. Another insulating layer 15 is formed on the common source region 13. The gate insulating layer 16, shaped to be a square cylinder, is provided at an inside wall with a floating gate electrode 17A, made of conductive poly-silicon. An inter-gate insulating layer 18A is formed on an inside wall of the floating gate electrode 17A. A control gate electrode 19A is formed on the inter-gate insulating layer 18.

According to the second preferred embodiment, shown in FIG. 4, the floating gate electrode 17A is formed to have a lower height in a cavity 10b so that the floating gate electrode 17A is not overlapped with the drain region 14. In other words, the floating gate electrode 17A is formed to have a height extending to the middle of the cavity 10b but not extending fully in the cavity 10b. The control gate electrode 19A is connected through the inter-gate insulating layer 18A to the floating gate electrode 17A, and is connected through the gate insulating layer 16 to the active regions 12 and drain region 14.

According to the above-described structure, a transistor for storage is formed to have a floating gate between the drain region 14 and source region 13. At the same time, a memory cell includes serially connected switching transistors having no floating gate.

Even if electrons in the floating gate 17A are over taken for data-writing and the memory transistor has a channel in depression state, data stored in the memory cell can be read out precisely and reliably. When a memory transistor (transistor for storage) gets in a depression state, electric current flows through the depression transistor and misreading happens even though the control gate electrode 19A is not selected. The switching transistors, serially connected to the memory transistor, are turned on and off in response to a selection signal supplied to the control gate electrode 19A; and therefore, misreading operation is prevented.

As described above, in addition to the advantages of the first preferred embodiment, the non-volatile memory according to the second preferred embodiment provides another advantage in that reading operation is stable without misreading.

Third Preferred Embodiment

Figure 5:
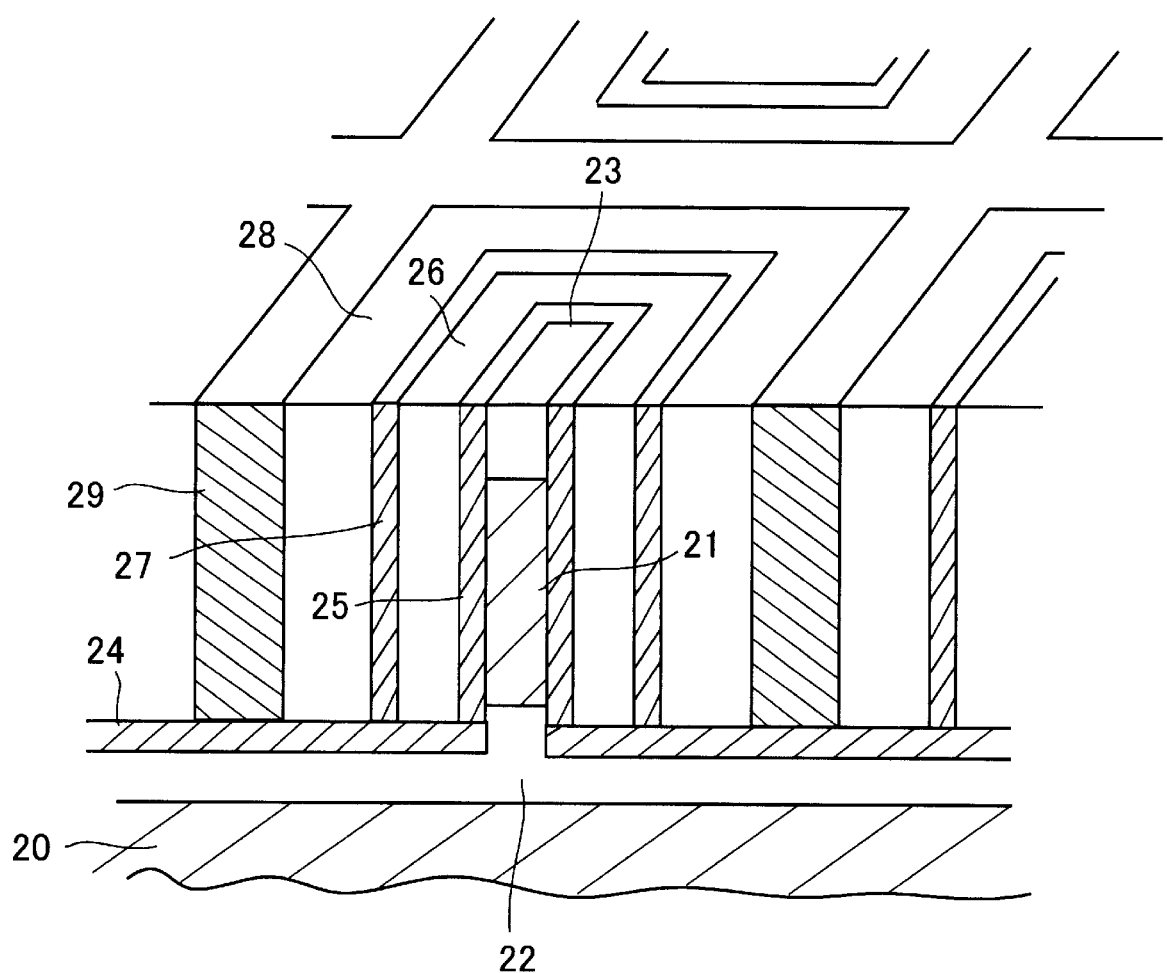
FIG. 5 is a cross-sectional view showing a part of a non-volatile memory according to a third preferred embodiment of the present invention.

FIG. 5 shows a non-volatile memory according to a third preferred embodiment of the present invention. The non-volatile memory includes a p-type silicon substrate 20 and pillar shape of active regions 21 formed on the silicon substrate 20. The active regions 21 are arranged in the orthogonal two directions with predetermined intervals. The non-volatile memory further includes a common source region 22 formed under the active regions 21 on the silicon substrate 20. The common source region 22 is formed by implanting n+ ions. A drain region 23 is formed on the active region 21 by implanting n-ions.

An insulating layer 24 is formed on the surface of the silicon substrate 20 except the active regions 21. The active region 21 is provided at an outer side surface with a gate insulating layer 25. The gate insulating layer 25 is arranged to surround the active region 21. A floating gate electrode is formed on a side surface of the gate insulating layer 25. An inter-gate insulating layer 27 is formed on a side surface of the floating gate electrode 26. Further, a control gate electrode 28 is formed on an outer side surface of the inter-gate insulating layer 27. On the outer surface of the control gate electrodes 28, a cell isolating layer 29 is formed to separate memory cells from each other.

In fabrication, the silicon substrate 20 is etched so that the pillar shape of active regions 21 are only left thereon. A nitride layer is formed on the side surface of the active regions 21. After that, arsenic and phosphorus ions are implanted using the nitride layer as a mask to form the common source region 22 and drain region 23.

Next, the nitride layer is removed from the active regions 21, and the gate insulating layer 25, floating gate electrode 26, inter-gate insulating layer 27 and control gate electrode 28 are formed around the active region 21 in order in a self alignment manner. Subsequently, the cell isolating layer 29 is filled in rooms formed by each two adjacent control gate electrodes 28, so that a non-volatile memory is completed, as shown in FIG. 5. Thus fabricated non-volatile memory operates in the same manner as the non-volatile memory according to the first preferred embodiment, shown in FIG. 2.

As described above, according to the third preferred embodiment, the floating gate electrode 26 and control gate electrode 28 are formed around the pillar shape active region 21, so that the inter-gate insulating layer 27 has a larger superficial area than the gate insulating layer 25. As a result, in addition to the advantages of the first preferred embodiment, the third preferred embodiment provides another advantage in that a coupling ratio of the memory becomes larger, so that writing and deleting operations can be carried out with a lower voltage. Further, all the elements other than the active regions 21 can be formed using no masks in self alignment manner, therefore, the fabrication process of the non-volatile memory becomes simpler.

Fourth Preferred Embodiment

Figure 6:
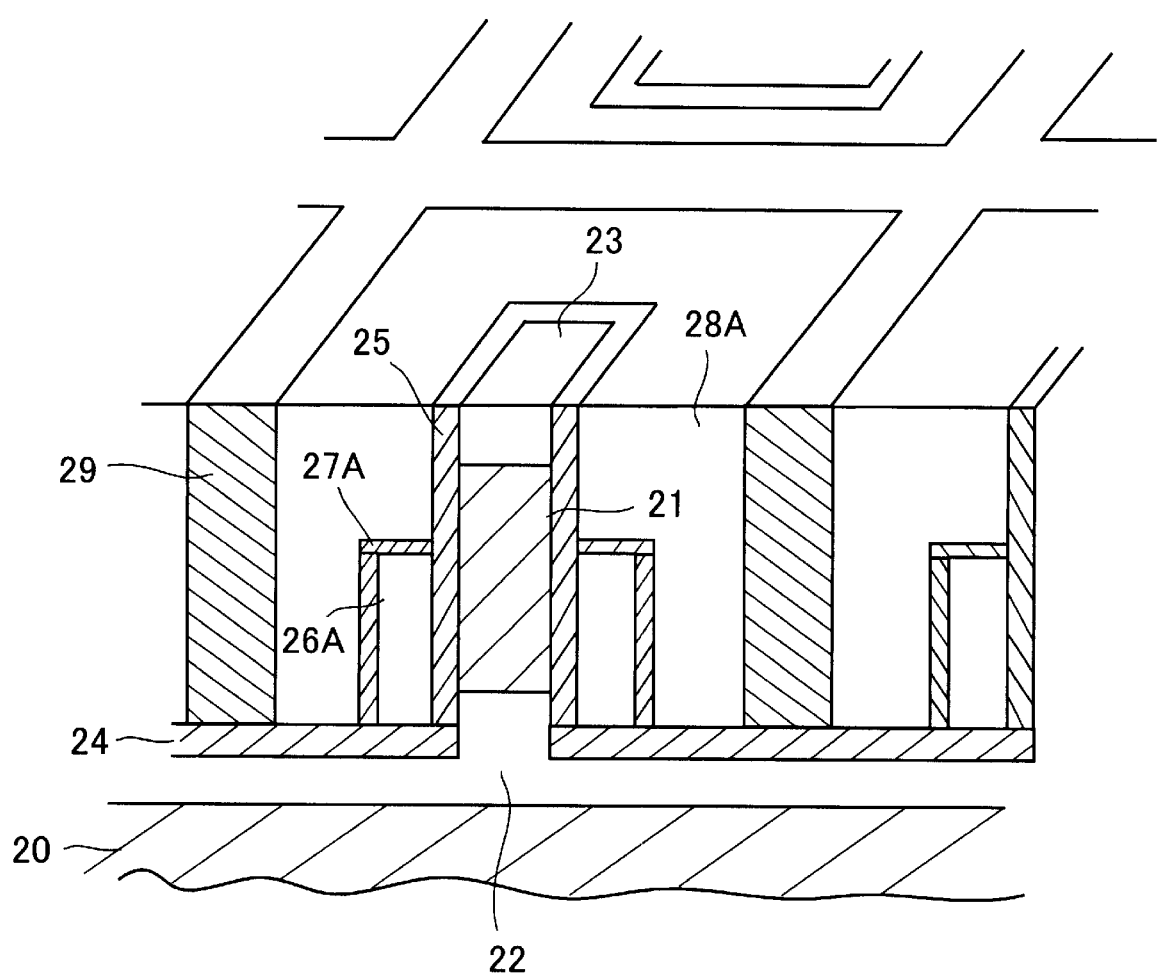
FIG. 6 is a cross-sectional view showing a part of a non-volatile memory according to a fourth preferred embodiment of the present invention.

FIG. 6 shows a non-volatile memory according to a fourth preferred embodiment of the present invention, in which the same or corresponding elements or components to those in the first to third preferred embodiments are represented by the same reference symbols. The differences from the non-volatile memory according to the third preferred embodiment, shown in FIG. 5, is the structure of floating gate electrode and control gate electrode.

The non-volatile memory includes a p-type silicon substrate 20 and pillar shape of active regions 21 formed on the silicon substrate 20. The active regions 21 are arranged in the orthogonal two directions with predetermined intervals. The non-volatile memory further includes a common source region 22 formed under the active regions 21 on the silicon substrate 20. The common source region 22 is formed by implanting n+ ions. A drain region 23 is formed on the active region 21 by implanting n-ions.

An insulating layer 24 is formed on the surface of the silicon substrate 20 except the active regions 21. The active region 21 is provided at an outer side surface with a gate insulating layer 25. The gate insulating layer 25 is arranged to surround the active region 21. An inter-gate insulating layer 27A is formed on an inside wall of a floating gate electrode 26A.

"According to the fourth preferred embodiment, shown in FIG. 6, the floating gate electrode 26A is formed to have a lower height so that the floating gate electrode 26A is not overlapped with the drain region 23. The control gate electrode 28A is connected through the inter-gate insulating layer 27A to the floating gate electrode 26A, and is connected through the gate insulating layer 25 to the active region 21 and drain region 23."

According to the above-described structure, a transistor for storage is formed to have a floating gate between the drain region 23 and source region 22. At the same time, a memory cell is formed to have serially connected switching transistors having no floating gate. The non-volatile memory operates in the same manner as the first preferred embodiment, shown in FIG. 2.

Even if electrons in the floating gate 26A are overtaken for data-writing and the memory transistor has a channel in depression state, data stored in the memory cell can be read out precisely and reliably. As described above, in addition to the advantages of the third preferred embodiment, the non-volatile memory according to the fourth preferred embodiment provides another advantage in that reading operation is stable without misreading.

Fifth Preferred Embodiment

Figure 7:
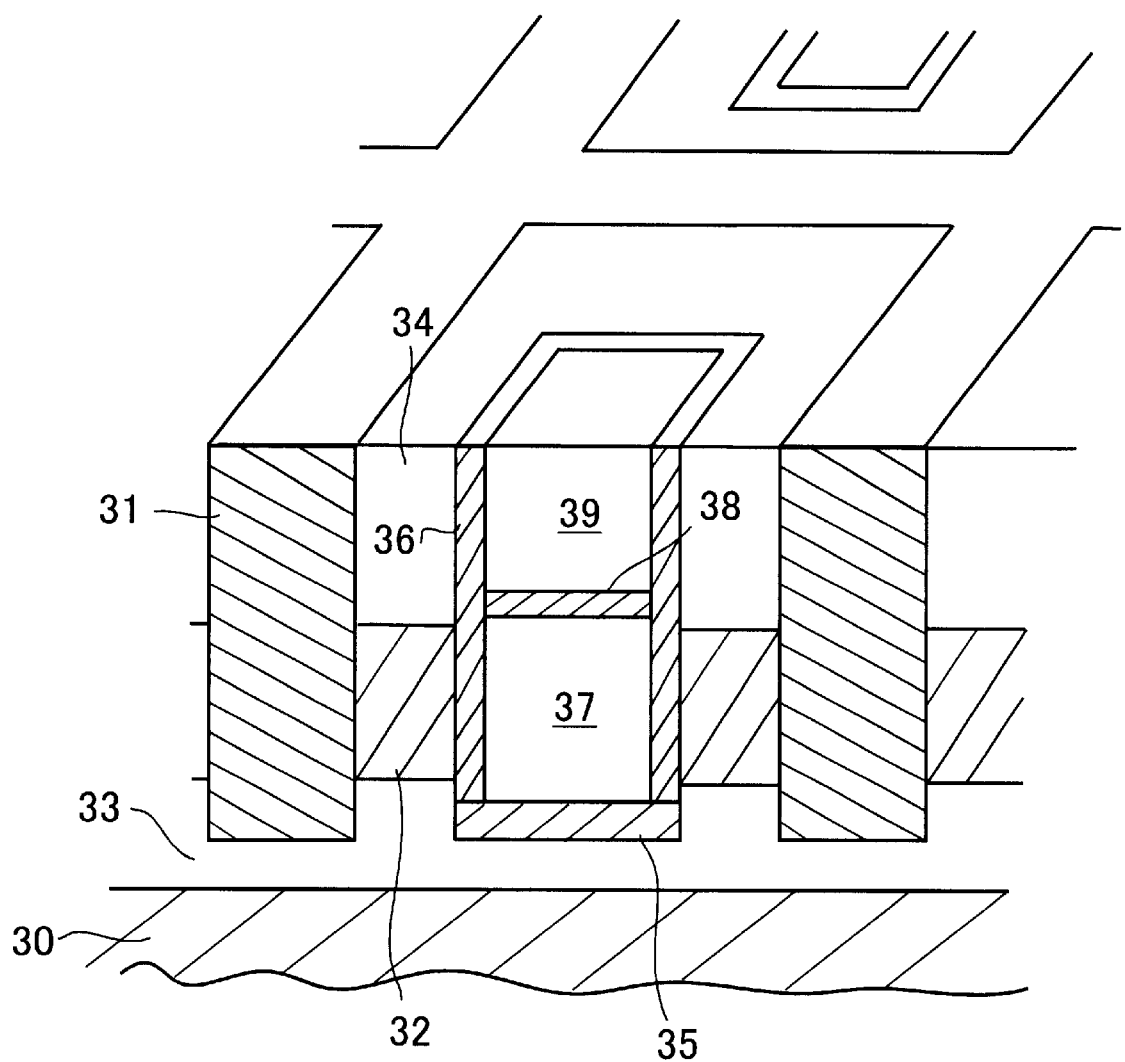
FIG. 7 is a cross-sectional view showing a part of a non-volatile memory according to a fifth preferred embodiment of the present invention.

FIG. 7 shows a non-volatile memory according to a fifth preferred embodiment of the present invention, in which the same or corresponding elements or components to those in the first to fourth preferred embodiments are represented by the same reference symbols.

A non-volatile memory according to the fifth preferred embodiment includes a p-type of silicon substrate 30, on which cell-isolating insulation layers 31 are formed in matrix to separate a plurality of memory cells. Each region segmented by the cell-isolating insulation layers 31 is designed to have inside walls provided with active regions 32, which is a part of the p-type silicon substrate 30. The memory further includes a common source region 33 formed on the silicon substrate 30 under the active regions 32. In the common source region 33, high density n+ ions are implanted. A common drain region 34 is formed on the active regions 32. In the common drain region 34, n-ions are implanted. The common source region 33, active regions 32 and drain region 34 form a channel for a transistor, which is used for storing data.

A gate insulating layer 36 is formed on an inside surface of the active regions 32, which is shaped to be a square cylinder. The gate insulating layer 36 is also formed on an inside surface of the common drain region 34. Another insulating layer 35 is formed on the common source region 33. A floating gate electrode 37, made of conductive polysilicon, is formed in a square cylinder shaped region surrounded by the insulating layers 35 and 36. The floating gate electrode 37 is filled in the lower half of the cavity formed by the insulating layers 35 and 36 so that the floating gate electrode 37 is contacted to the active region 32 through the gate insulating layer 36. An inter-gate insulating layer 38 is formed on the upper surface of the floating gate electrode 37. A control gate electrode 39 is formed on the inter-gate insulating layer 38.

Thus fabricated non-volatile memory operates in the same manner as the first preferred embodiment, shown in FIG. 2.

As described above, according to the fifth preferred embodiment, shown in FIG. 7, the floating gate electrode 37, inter-gate insulating layer 38 and control gate electrode 39 are layered in the cavity surrounded by the insulating layers 35 and 36 in that order parallel to the silicon substrate 30. As a result, the cavity region surrounded by the insulating layers 35 and 36 can be designed smaller in size; and therefore, there is an advantage in that integration of the non-volatile memory can be improved in addition to the advantages of the first preferred embodiment.

Sixth Preferred Embodiment

Figure 8:
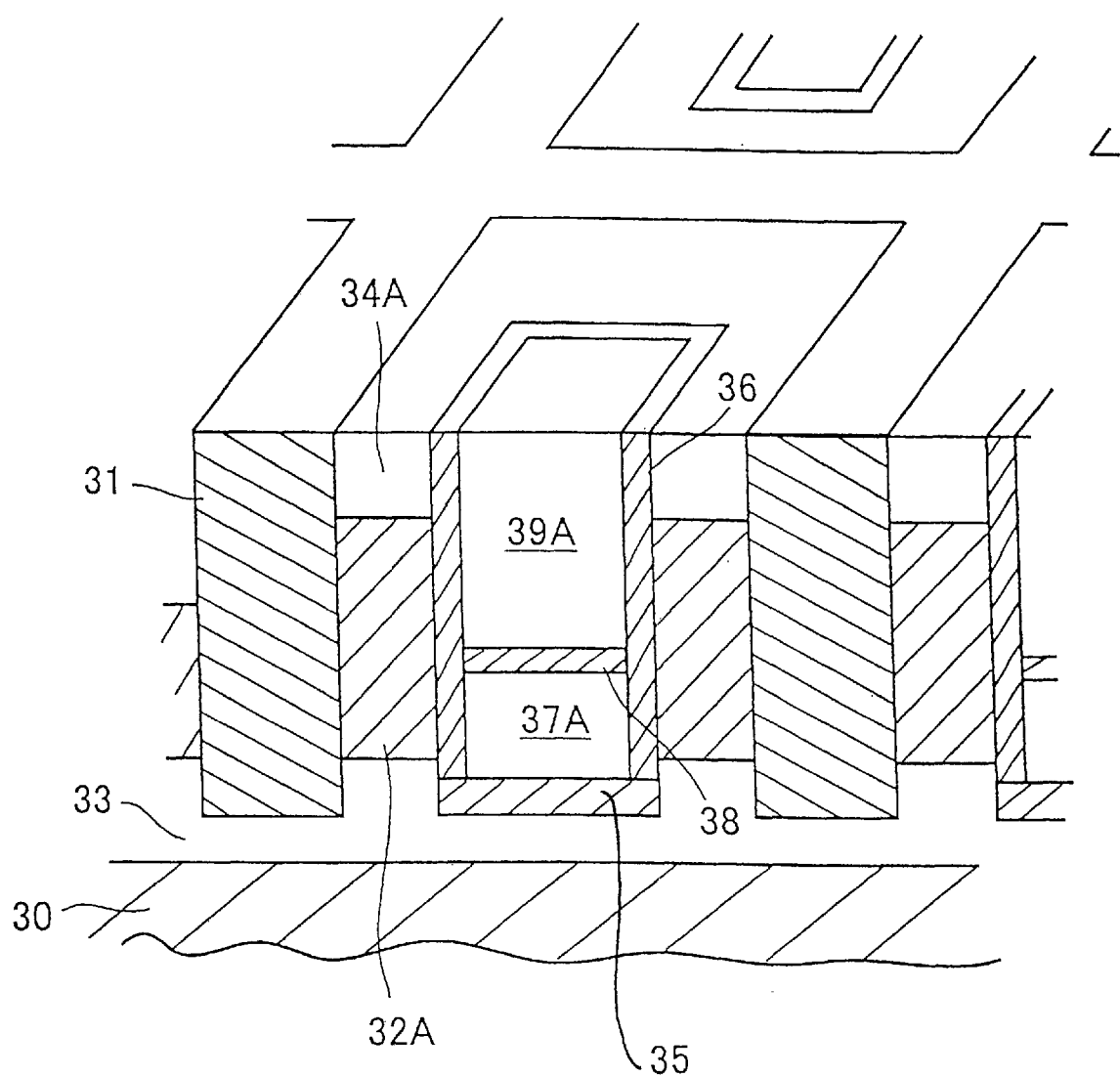
FIG. 8 is a cross-sectional view showing a part of a non-volatile memory according to a sixth preferred embodiment of the present invention.

FIG. 8 shows a non-volatile memory according to a sixth preferred embodiment of the present invention, in which the same or corresponding elements or components to those in the first to fifth preferred embodiments are represented by the same reference symbols. The differences from the fifth preferred embodiment is the arrangement or position relation among floating gate electrode, control gate electrode and active region.

A non-volatile memory according to the sixth preferred embodiment includes a p-type of silicon substrate 30, on which cell-isolating insulation layers 31 are formed in matrix to separate a plurality of memory cells. Each region segmented by the cell-isolating insulation layers 31 is designed to have inside walls provided with active regions 32A, which is a part of the p-type silicon substrate 30. The memory further includes a common source region 33 formed on the silicon substrate 30 under the active regions 32A. In the common source region 33, high density n+ ions are implanted. A common drain region 34A is formed on the active regions 32A. In the common drain region 34A, n-ions are implanted. The common source region 33, active regions 32A and drain region 34A form a channel for a transistor, which is used for storing data.

A gate insulating layer 36 is formed on an inside surface of the active regions 32A, which is shaped to be a square cylinder. The gate insulating layer 36 is also formed on an inside surface of the common drain region 34A. Another insulating layer 35 is formed on the common source region 33. A floating gate electrode 37A, made of conductive poly-silicon, is formed in a square cylinder shaped region surrounded by the insulating layers 35 and 36. The floating gate electrode 37A is filled in the lower half of the cavity formed by the insulating layers 35 and 36 so that the floating gate electrode 37A is contacted to the active region 32A through the gate insulating layer 36. An inter-gate insulating layer 38 is formed on the upper surface of the floating gate electrode 37A. A control gate electrode 39A is formed on the inter-gate insulating layer 38.

One of the important things for this embodiment is that the floating gate electrode 37A is formed to have a lower height so as not to be overlapped with the drain region 34A. Further, the control gate electrode 39A is formed to be contact with the active region 32A and drain region 34A through the gate insulating layer 36. The other structure of the non-volatile memory according to the sixth preferred embodiment is the same as that according to the fifth preferred embodiment.

In each memory cell of the non-volatile memory, a memory transistor having a floating gate and a switching transistor having no floating gate are connected serially between the drain region 34A and common source region 32. Thus fabricated non-volatile memory operates in the same manner as the first preferred embodiment, shown in FIG. 2.

As described above, in addition to the advantages of the fifth preferred embodiment, the non-volatile memory according to the sixth preferred embodiment provides another advantage in that reading operation is stable without misreading even if electros are over taken from the floating gate electrode 37A for data-writing. The floating gate electrode 37A, inter-gate insulating layer 38 and control gate electrode 39A are layered in the cavity surrounded by the insulating layers 35 and 36 in that order parallel to the silicon substrate 30. As a result, the cavity region surrounded by the insulating layers 35 and 36 can be designed smaller in size; and therefore, there is an advantage in that integration of the non-volatile memory can be improved in addition to the advantages of the first preferred embodiment.

The present invention can be modified or changed within the scope of the claims as follows, for example:

(a) A p-type source region and a p-type drain region may be formed on an n-type silicon substrate, although in the above described preferred embodiment, an n-type source region and an n-type drain region are formed on a p-type silicon substrate.

(b) The sizes of gate electrodes and thickness of the insulating layers may be changed.

(c) The fabrication steps may be changed.

What is claimed is:

1. A non-volatile memory, comprising:
   a substrate;
   a floating gate electrode and a control gate electrode formed on the substrate; and
   an active layer formed around the control gate electrode and the floating gate electrode, wherein
      the active layer has a source, a drain and a channel layer between the source and the drain, and
      a main surface of the active layer and a main surface of the floating gate electrode face each other and extend vertically with respect to a main surface of the substrate.

2. A non-volatile memory according to claim 1, wherein the floating gate electrode is formed around the control gate electrode.

3. A non-volatile memory according to claim 2, wherein the floating gate electrode is formed so as to be a cylindrical shape.

4. A non-volatile memory according to claim 1, wherein an insulating layer is formed on the floating gate electrode;
   the control gate electrode is formed on the insulating layer.

5. A non-volatile memory according to claim 1, wherein the floating gate electrode and the active layer are formed so as to be a cylindrical shape.

6. A non-volatile memory according to claim 1, wherein the source is formed on the substrate.

7. A non-volatile memory according to claim 1, wherein the source comprises a common source region used for a plurality of memory cells of the non-volatile memory.

8. A non-volatile memory according to claim 1, wherein a cell isolating layer is formed on the substrate to make a cavity in which the non-volatile memory is formed.

9. A non-volatile memory according to claim 1, wherein the active layer is formed to be overlapped with the floating gate electrode in a first direction, which is parallel to the substrate.

10. A non-volatile memory according to claim 1, wherein the active layer is formed not to be overlapped completely with the floating gate electrode in a first direction, which is parallel to the substrate.

11. A non-volatile memory, comprising:

a substrate;

a floating gate electrode and a control gate electrode formed on the substrate; and an active layer formed around the control gate electrode and the floating gate electrode, wherein
the active layer has a source, a drain and a channel layer between the source and the drain, and
a main surface of the active layer and a main surface of the floating gate electrode are both perpendicular to a main surface of the substrate, and are adjacent to and face each other.

12. A non-volatile memory according to claim 11, wherein the floating gate electrode is formed around the control gate electrode.

13. A non-volatile memory according to claim 12, wherein the floating gate electrode is formed so as to have a cylindrical shape.

14. A non-volatile memory according to claim 11, wherein an insulating layer is formed on the floating gate electrode and the control gate electrode is formed on the insulating layer.

15. A non-volatile memory according to claim 11, wherein the floating gate electrode and the active layer are formed so as to have a cylindrical shape.

16. A non-volatile memory according to claim 11, wherein the source is formed on the substrate.

17. A non-volatile memory according to claim 11, wherein the source comprises a common source region used for a plurality of memory cells of the non-volatile memory.

18. A non-volatile memory according to claim 11, wherein a cell isolating layer is formed on the substrate to make a cavity in which the non-volatile memory is formed.

19. A non-volatile memory according to claim 11, wherein the active layer is formed to be overlapped with the floating gate electrode in a first direction, which is parallel to the substrate.

20. A non-volatile memory according to claim 11, wherein the active layer is formed not to be overlapped completely with the floating gate electrode in a first direction, which is parallel to the substrate.

* * * * *